(12) United States Patent
Hori et al.

(10) Patent No.: US 8,736,360 B2
(45) Date of Patent: May 27, 2014

(54) OUTPUT CONDUCTANCE AUTOMATIC REGULATION CIRCUIT OF DIFFERENTIAL CURRENT OUTPUT TYPE CIRCUIT AND FILTER CIRCUIT

(75) Inventors: Shinichi Hori, Tokyo (JP); Noriaki Matsuno, Tokyo (JP)

(73) Assignee: Nec Corporation, Tokyo (JP)

( * ) Notice: Subject to any disclaimer, the term of this patent is extended or adjusted under 35 U.S.C. 154(b) by 962 days.

(21) Appl. No.: 12/309,195

(22) PCT Filed: Mar. 22, 2007

(86) PCT No.: PCT/JP2007/055815
§ 371 (c)(1),
(2), (4) Date: Jan. 9, 2009

(87) PCT Pub. No.: WO2008/010331
PCT Pub. Date: Jan. 24, 2008

(65) Prior Publication Data
US 2009/0289699 A1 Nov. 26, 2009

(30) Foreign Application Priority Data

Jul. 19, 2006 (JP) .................................. 2006-196663

(51) Int. Cl.
*H03B 1/00* (2006.01)
*H03H 11/12* (2006.01)
(52) U.S. Cl.
CPC ................................. *H03H 11/1291* (2013.01)
USPC .......................................................... 327/553
(58) Field of Classification Search
USPC ...................... 327/31, 34, 551–559
See application file for complete search history.

(56) References Cited

U.S. PATENT DOCUMENTS

| | | | |
|---|---|---|---|
| 5,343,172 A | 8/1994 | Utsu et al. | |
| 5,912,583 A * | 6/1999 | Pierson et al. | ................. 327/553 |
| 6,466,090 B1 * | 10/2002 | Giuroiu | ........................... 330/86 |
| 6,476,676 B1 * | 11/2002 | Tanaka et al. | ................. 330/258 |
| 2005/0156661 A1 * | 7/2005 | Kimura | ......................... 327/552 |
| 2008/0258826 A1 * | 10/2008 | Chatterjee et al. | ........ 331/108 R |

FOREIGN PATENT DOCUMENTS

| | | |
|---|---|---|
| JP | 5-251964 | 9/1993 |
| JP | 6-342561 | 12/1994 |

(Continued)

OTHER PUBLICATIONS

"A Practical Quality Factor Tuning Scheme for IF and High-Q Continuous-Time Filters" Jan-Michael Stevenson and Edgar Sanchez-Sinencio, ISSCC Dig. Tech. Papers Feb. 1998, pp. 218-219.

*Primary Examiner* — Sibin Chen
(74) *Attorney, Agent, or Firm* — McGinn IP Law Group, PLLC

(57) ABSTRACT

Output conductance of a differential current output type circuit constituting a filter body (1) and having a variable negative resistor connected between differential output lines is automatically regulated. The output conductance automatic regulation circuit comprises a differential voltage/current conversion circuit (2) which is a replica of a differential voltage/current conversion circuit constituting the filter body (1), a variable negative resistor (3) connected between the differential output lines of the differential voltage/current conversion circuit (2), a detector (4) for detecting the DC potential difference between the differential output lines of the differential voltage/current conversion circuit (2), and a controller (5) for controlling the differential voltage/current conversion circuit (2) and the conductance of a variable negative resistor connected with the differential voltage/current conversion circuit constituting the filter body (1) based on the detection results from the detector (4).

8 Claims, 10 Drawing Sheets

(56) References Cited

FOREIGN PATENT DOCUMENTS

| JP | 7-212187 | 8/1995 |
| JP | 8-204504 | 8/1996 |
| JP | 10-209810 | 8/1998 |
| JP | 2002-094357 | 3/2002 |
| JP | 2002-198755 | 7/2002 |
| JP | 2005-348109 | 12/2005 |

* cited by examiner

| $D_{n-1}$ | $D_n$ | $R_{n-1}$ | $R_n$ | $out_{n-1}$ |
|---|---|---|---|---|
| H | H | L | L | H |
| L | L | L | L | L |
| H | L | L | H | L |
| L | H | L | H | H |
| — | — | H | H | — |

| $out_n$ | $R_{n-1}$ | $R_n$ | $outr_n$ |
|---|---|---|---|
| L | L | L | level is decremented one step |
| H | L | L | level is incremented one step |
| — | L | H | set level to state two clock pulses earlier |
| | H | — | keep level in state at preceding clock pulse |

OUTPUT CONDUCTANCE AUTOMATIC REGULATION CIRCUIT OF DIFFERENTIAL CURRENT OUTPUT TYPE CIRCUIT AND FILTER CIRCUIT

TECHNICAL FIELD

The present invention relates to an automatic output conductance adjusting circuit for automatically adjusting the output conductance of a differential current output type circuit to a desired value such as a nil value, and a filter circuit.

BACKGROUND ART

There are high-functionality devices made up of a variety of interconnected circuit blocks, typified by wireless devices. With the development of process technology in recent years, it is possible to fabricate such high-functionality devices as a one-chip IC (Integrated Circuit).

A filter circuit, which is one of the circuit blocks making up a wireless device, serves to remove signals in unwanted frequency bands and to allow signals to pass in desired frequency bands. Therefore, the filter circuit is required to have frequency characteristics of higher accuracy than the other circuit blocks.

If a filter circuit is to achieve cutoff characteristics of secondary or higher order as a filter function, then the filter needs to use an active filter having active elements in its filter section. The active filter often comprises a gm-C filter which takes up a small area and which operates at high speed. The gm-C filter comprises a voltage-to-current converting circuit having active elements and a capacitor. The gm-C filter usually includes an automatic adjusting circuit for adjusting the deviation between designed values and actual frequency characteristics due to production process variations. The automatic adjusting circuit performs two adjusting processes, i.e., cutoff frequency adjustment (F-tune) and Q factor adjustment (Q-tune).

The F-tune refers to the following correcting technology. The cutoff frequency of the filter section is determined by the parameters of a capacitance value and a conversion gain of the capacitor and the voltage-to-current converting circuit of the filter section. If these parameters are shifted from designed values due to production process variations, then the actual value of the cutoff frequency is also shifted from the designed value. The F-tune is the technology for correcting the shift.

The Q-tune refers to the following correcting technology. The capacitor and the voltage-to-current converting circuit of the filter section include a parasitic resistance which is difficult to estimate sufficiently by way of simulations. The parasitic resistance tends to degrade the gain of the filter section from the designed value particularly in the vicinity of the cutoff frequency. The Q-tune is the technology for correcting the degradation of the gain.

Generally, the F-tune is frequently carried out. However, the Q-tune is not usually performed for filter circuits having gradual cutoff characteristics of fourth or lower order which can satisfy specifications according to many communication systems. The reason for this is that the filter circuits having gradual cutoff characteristics have a small gain sensitivity to the parasitic resistance in the vicinity of the cutoff frequency and are not essentially susceptible to gain degradations. However, filter circuits having sharp cutoff characteristics of fifth or higher order have a large gain sensitivity to the parasitic resistance in the vicinity of the cutoff frequency and are susceptible to gain degradations. In such a case, it is necessary to perform the Q-tune.

The effect that the parasitic resistance of the filter section of a second-order low-pass filter circuit on the gain will be described below.

FIG. 1 is a block diagram showing the configuration of a filter section using a gm-C filter in a second-order low-pass filter circuit.

In FIG. 1, voltage-to-current converting circuits ($Gm_1$ through $Gm_4$) 47 through 50 are circuits for outputting a current depending on an input voltage, and have respective conversion gains $gm_1$ through $gm_4$. Capacitors ($C_1, C_2$) 51, 52 have respective capacitance values $c_1, c_2$. Parasitic resistors ($G_{par1}, G_{par2}$) 53, 54 that are parasitically added to the respective nodes have parasitic conductances $g_{par1}$, $g_{par2}$, respectively.

Usually, the parasitic conductance of a parasitic resistor is substantially equal to the sum of the output conductances of voltage-to-current converting circuits which are connected to each node. The degree to which the parasitic conductance affects the gain of the filter section is clarified by a transfer function according to the following equation 1:

$$T(s) = \frac{-\frac{gm_1 gm_2}{C_1 C_2}}{s^2 + \left(\frac{gm_4 + g_{par1}}{C_1} + \frac{g_{par2}}{C_2}\right)s + \frac{gm_2 gm_3 + (gm_4 + g_{par1})g_{par2}}{C_1 C_2}} \quad \text{[Equation 1]}$$

Equation 1 indicates that as the parasitic conductance is greater, the gain becomes degraded.

The gain degradation at a cutoff frequency $\omega_0$ is clarified by the following equation 2 which represents the gain at the cutoff frequency $\omega_0$:

$$A_v(\omega_0) = |T(\omega_0)| = \frac{\frac{gm_1 gm_2}{C_1 C_2}}{\left(\frac{gm_4 + g_{par1}}{C_1} + \frac{g_{par2}}{C_2}\right)\omega_0} \quad \text{[Equation 2]}$$

$\omega_0$ is expressed by the following equation 3:

$$\omega_0 = \sqrt{\frac{gm_2 gm_3 + (gm_4 + g_{par1})g_{par2}}{C_1 C_2}} \quad \text{[Equation 3]}$$

If $gm_2$ and $gm_3$ and $c_1$ and $c_2$ are designed substantially equally, then equation 2 is expressed by equation 4 below. $gm_2$ is approximated to a value that is sufficiently larger than $g_{par2}$.

$$A_{v1}(\omega_0) = \frac{gm_1}{(1+\alpha) \cdot gm_4} \quad \text{[Equation 4]}$$

where $\alpha$ is expressed by the following equation (5):

$$\alpha = \frac{g_{par1} + g_{par2}}{gm_4} \quad \text{[Equation 5]}$$

Equation 4 indicates that the rate at which $1+\alpha$ increases and the rate at which the gain decreases are equal to each other.

The transfer function of a high-order filter circuit includes, as factors, a plurality of transfer functions of the second-order low-pass filter circuit indicated by equation 1. As the order becomes higher, $gm_4$ of each of the transfer functions usually becomes smaller. Therefore, the value of α becomes greater as indicated by equation 5, and the gain is greatly degraded as indicated by equation 4.

The Q-tune is generally realized by correcting the gain of a replica of a portion of the circuit blocks that make up the filter section. In other words, it is possible to correct the gain of the filter section by imparting a corrective signal generated to correct the gain of the replica to the filter section. It is possible to minimize the deviation between the gains of the filter section and the replica due to production process variations by sufficiently holding the filter section and the replica closely to each other in the chip layout.

In the replica and the filter section, the parasitic conductance which brings out the gain degradation essentially comprises the output conductance of each of the voltage-to-current converting circuits of the replica and the filter section.

In the replica, a negative resistor is connected to the output node of each voltage-to-current converting circuit of the replica. A corrective signal is generated such that the sum of the negative resistance and the output conductance of each voltage-to-current converting circuit is nil, and applied to the negative resistor.

In the filter section, the corrective signal generated by the replica is applied to a negative resistor connected to the output node of each voltage-to-current converting circuit of the filter section. As is the case with the replica, the sum of the negative resistance and the output conductance of each voltage-to-current converting circuit is adjusted to nil. The gain of the filter section is thus corrected.

A circuit for correcting the gain of the replica is generally of such a configuration that the output amplitude of the replica which is supplied with an input AC signal from an external source is detected by a peak detector or the like, and the negative resistor is controlled to equalize the detected value to a desired value.

A filter circuit disclosed in Patent document 1 incorporates the above configuration directly into a filter section for correcting the gain, without the need for a replica. The arrangement of the filter circuit disclosed in Patent document 1 is shown in FIG. 2.

The filter circuit shown in FIG. 2 comprises voltage-to-current converting circuits 55, 56 of the differential current output type, load resistor (NIC) 57, peak detector 58, and digital-to-analog converter (DAC) 59, and register 60. 61 through 63 denote standard currents.

For correcting the gain of the filter circuit shown in FIG. 2, the output amplitude of voltage-to-current converting circuit 56 which is supplied with an input AC signal from an external source is detected by peak detector 58, and negative resistor 57 is controlled based on the result of a comparison between the detected amplitude value and a preset amplitude value from register 60.

FIG. 3 is a diagram of the frequency characteristics of a second-order low-pass filter circuit, showing characteristic curves plotted when the value of α is positive, nil, and negative.

The characteristic curve plotted when the value of α is nil is a desired filter characteristic curve. Since the negative resistance cancels out the parasitic conductance according to the Q-tune, the value of α is adjusted to a value that is nearly nil, adjusting the filter section to desired frequency characteristics. The adjusting accuracy mainly depends on the detecting accuracy of the peak detector for detecting the output amplitude. If the detecting accuracy of the peak detector is low, then the adjusting process is completed when the value of α is significantly different from nil.

Non-patent document 1 discloses a filter circuit which uses no peak detector. The arrangement of the filter circuit disclosed in Non-patent document 1 is shown in FIG. 4.

In the filter circuit shown in FIG. 4, the difference between the amplitude of a reference signal input to replica (Master Biquad) 65 and the amplitude of an AC signal output from replica 65 is detected, and the filter circuit is controlled to make the detected value nil. The difference is detected by differential device 66 and multiplier 67. Therefore, the filter circuit does not need a peak detector.

Since the peak detector is difficult to fabricate to a nicety, the configuration shown in FIG. 4 makes it possible to achieve the Q-tune with high accuracy.

As described above, the filter circuits of the background art need to detect the amplitude of a signal input to the filter section or its replica.

As disclosed in Patent document 1, however, in order to detect the amplitude of the AC signal highly accurately with the peak detector, the linearity of the circuit operation of the peak detector needs to be increased. Generally, the increased linearity requires a complex circuit for performing linearity compensation, with the results that the filter circuit consumes increased electric power and takes up an increased chip area.

As disclosed in Non-patent document 1, in order to increase the accuracy with which to detect the amplitude of the AC signal with the differential device and the multiplier, the linearity of the circuit operation of the differential device and the multiplier also needs to be increased. The increased linearity also makes the filter circuit consume increased electric power and take up an increased chip area, as is the case with the filter circuit requiring increased accuracy of the peak detector.

If the AC signal component input to the peak detector leaks out into a Q-tune control signal line of the filter circuit, then the operation of the filter circuit becomes unstable. One approach to stably operate the filter circuit would be to insert a new circuit for removing the AC signal component that has leaked out into the control signal line. This approach would also cause the filter circuit to consume increased electric power and take up an increased chip area.

As described above, it has been difficult for the filter circuits described in the background art to achieve low electric power consumption, to take up a small chip area, and to achieve highly accurate Q-tune.

To solve the above problems, it is necessary to have an automatic output conductance adjusting circuit for automatically adjusting the output conductance of a voltage-to-current converting circuit of a filter section with high accuracy, while making a filter circuit consume low electric power and take up a small chip area.

Patent document 1: JP-A No. 6-342561 (FIG. 1)

Non-patent document 1: Jan-Michael Stevenson and Edgar Sanchez-Sinencio, "A Practical Quality Factor Tuning Scheme for IF and High-Q Continuous-Time Filters", ISSCC Dig. Tech. Papers, February, 1998, pp. 218-219.

DISCLOSURE OF THE INVENTION

It is an object of the present invention to provide an automatic output conductance adjusting circuit for automatically adjusting the output conductance of a differential current output type circuit for a filter circuit whose filter section includes voltage-to-current converting circuits of the differential current output type, with high accuracy, white making the filter circuit consume low electric power and take up a small chip area.

To achieve the above object, there is provided in accordance with the present invention an automatic output conductance adjusting circuit for automatically adjusting the output conductance of a differential current output type circuit having a variable negative resistor connected between differential output lines thereof, comprising:

a replica of the differential current output type circuit;
a variable negative resistor connected between differential output lines of the replica;
a detector for detecting a DC potential difference between the differential output lines of the replica; and
a controller for controlling a conductance of the variable negative resistor connected between the differential output lines of the differential current output type and the replica based on the DC potential difference detected by the detector.

According to the present invention, since the variable negative resistor is connected between the differential output lines of the differential current output type circuit, the output conductance of the differential current output type circuit is expressed as the sum of the conductance of the variable negative resistor and the parasitic conductance between the differential output lines of the differential current output type circuit.

Usually, the conductance of the variable negative resistor takes a negative value, and the parasitic conductance of the differential current output type circuit takes a positive value.

For example, if the sum of the conductance of the variable negative resistor and the parasitic conductance of the differential current output type circuit is positive, then when a differential signal input to the differential current output type circuit is nil, then DC potential difference between the differential output lines is nil.

If the sum of the conductance of the variable negative resistor and the parasitic conductance of the differential current output type circuit is negative, then a small potential variation due to thermal noise or the like is amplified, and the absolute value of the DC potential difference between the differential output lines becomes a value greater than nil.

According to the present invention, inasmuch as the variable negative resistor, the detector, and the controller make up a positive feedback loop, the variable negative resistor can be controlled to allow the DC potential difference between the differential output lines to have a desired value. For example, if the absolute value of the DC potential difference between the differential output lines is a certain value A greater than nil, then the conductance of the variable negative resistor is controlled so as to be of a value that is greater than the parasitic conductance of the differential current output type circuit. At this time, conductance between the differential output lines can be adjusted highly accurately to nil by setting value A to a value that is sufficiently close to nil.

The present invention makes it possible to achieve highly accurate Q-tune by being applied to an automatic output conductance adjusting circuit for a differential current output type circuit of a filter section.

According to the present invention, furthermore, since only DC voltages and direct currents are handled, the circuit configuration is simple, and the electric power consumption and the chip area taken up by the automatic output conductance adjusting circuit are reduced.

BEST MODE FOR CARRYING OUT THE INVENTION

The best mode for carrying out the present invention will be described below with reference to the drawings.
(1st Exemplary Embodiment)

Figure 5:
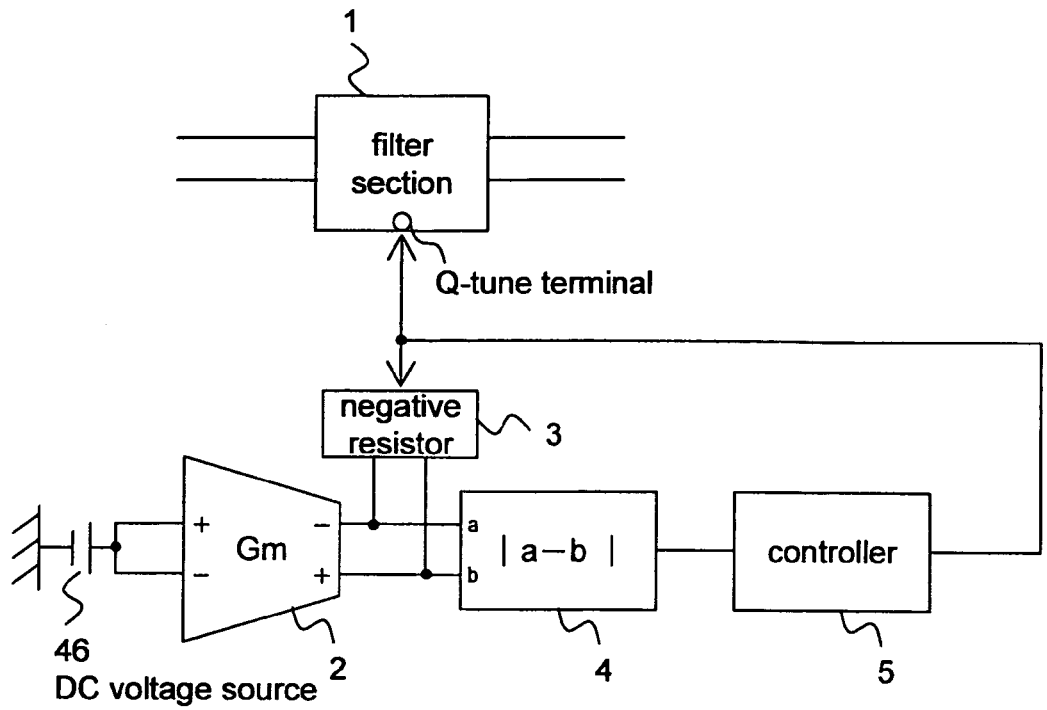
FIG. 5 is a block diagram showing the configuration of an automatic output conductance adjusting circuit according to a first exemplary embodiment of the present invention.

FIG. 5 is a block diagram showing the configuration of an automatic output conductance adjusting circuit according to a first exemplary embodiment of the present invention.

As shown in FIG. 5, the automatic output conductance adjusting circuit according to the present exemplary embodiment is disposed in a filter circuit and serves to automatically adjust the output conductance of differential voltage-to-current converting circuits, which are differential current output type circuits, in filter section 1.

Figure 6:
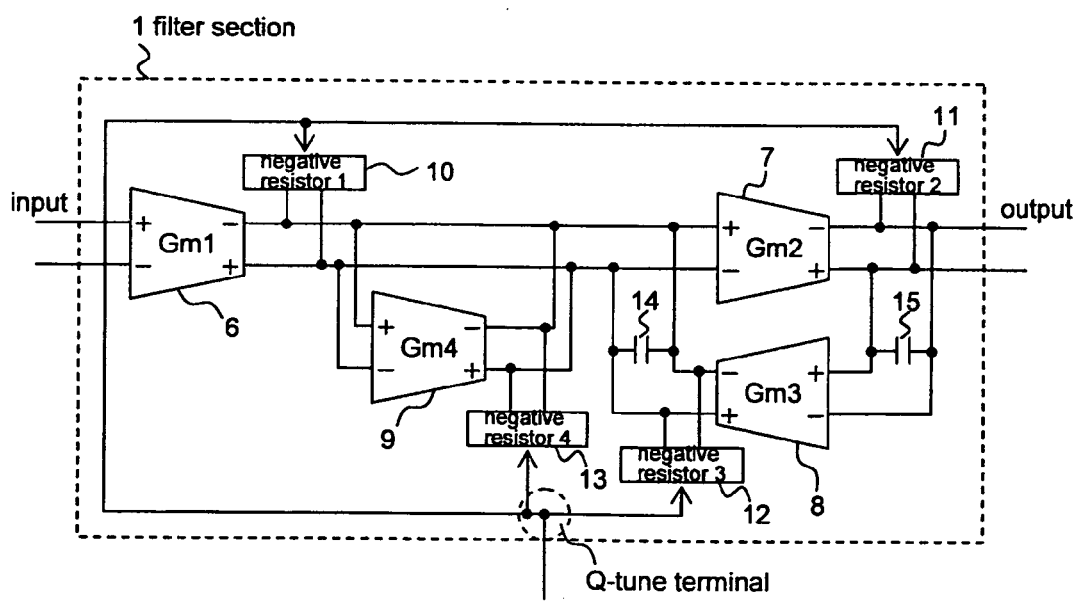
FIG. 6 is a circuit diagram showing the configuration of a filter section shown in FIG. 5.

The automatic output conductance adjusting circuit according to the present exemplary embodiment comprises differential voltage-to-current converting circuit 2, variable negative resistor 3, detector 4, and controller 5. As shown in FIG. 6, filter section 1 is a gm-C filter comprising differential voltage-to-current converting circuits 6 through 9, which are differential current output type circuits, and capacitors 14, 15. Variable negative resistors 10 through 13 are connected between the differential output lines of respective voltage-to-current converting circuits 6 through 9. Of these variable negative resistors, variable negative resistors 10, 12, 13 are connected parallel to the same node, and hence can be combined into one variable negative resistor. Variable negative resistors 10 through 13 have control terminals connected to a Q-tune terminal.

Differential voltage-to-current converting circuit 2 is a replica of voltage-to-current converting circuits 6 through 9 of filter section 1. Differential voltage-to-current converting circuit 2 has differential input lines short-circuited and connected to DC voltage source 46 (whose voltage value is indicated by Vdc), and differential output lines between which variable negative resistor 3 is connected.

Variable negative resistor 3 has its conductance controllable by a control signal that is input from controller 5 to its control terminal.

Detector 4 detects the absolute value of a DC potential difference between the differential output lines of differential voltage-to-current converting circuit 2, and outputs a voltage signal which is proportional, or corresponds 1:1, to the detected absolute value to controller 5. Controller 5 generates a control signal which is proportional, or corresponds 1:1, to the difference between the voltage signal from detector 4 and a reference voltage held in controller 5, and outputs the generated control signal to the control terminal of variable negative resistor 3 and the Q-tune terminal of filter section 1.

As described later, the value of the DC potential difference between the differential output lines of differential voltage-to-current converting circuit 2 depends on the conductance of variable negative resistor 3. Specifically, if the conductance of variable negative resistor 3 is represented by $-g_{neg}$ ($g_{neg}$ is of a positive value) and the parasitic conductance of a parasitic resistor at the output node of differential voltage-to-current converting circuit 2 is represented by $g_{par}$, then when the sum ($g_{par}-g_{neg}$) of the conductances is of a positive value, the DC potential difference is substantially nil, and when the sum is of a negative value, the DC potential difference is greater as the absolute value of the sum is greater.

It is possible to control variable negative resistor 3 to adjust the DC potential difference to a desired value through a feedback loop made up of variable negative resistor 3, detector 4, and controller 5. The DC potential difference which will finally be stabilized by the feedback loop is set to the reference voltage held in controller 5. If the reference voltage is set such that the DC potential difference is of positive value A, then $g_{neg}$ is adjusted to a certain value which is greater than $g_{par}$. As value A is set closer to nil, $g_{neg}$ is adjusted more accurately to value $g_{par}$. In other words, with the above feedback loop arrangement, the absolute value of the sum of parasitic conductance $g_{par}$ of differential voltage-to-current converting circuit 2 and conductance $g_{neg}$ of variable negative resistor 3 is rendered stable at or below a preset value (reference voltage).

Figure 1:
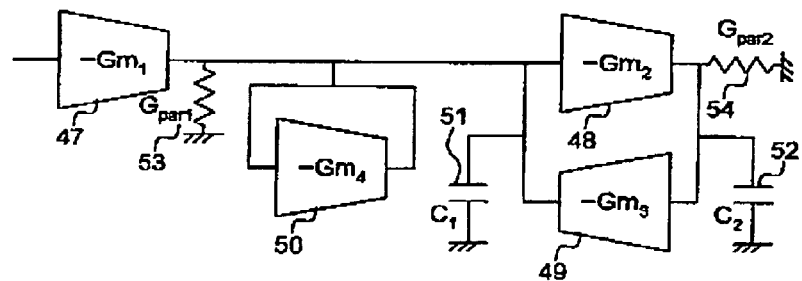
FIG. 1 is a circuit diagram showing a configurational example of a filter section of a second-order low-pass filter circuit according to the background art.
Figure 2:
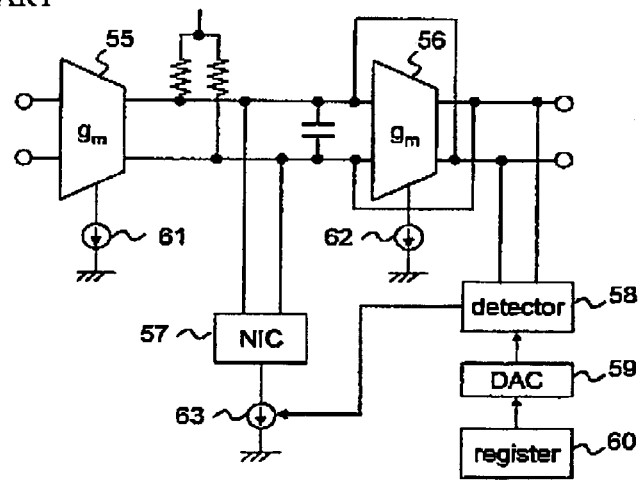
FIG. 2 is a circuit diagram showing another configurational example of a filter circuit according to the background art.
Figure 3:
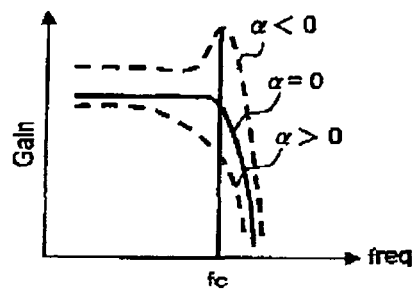
FIG. 3 is a diagram of the frequency characteristics of a general second-order low-pass filter circuit.
Figure 4:
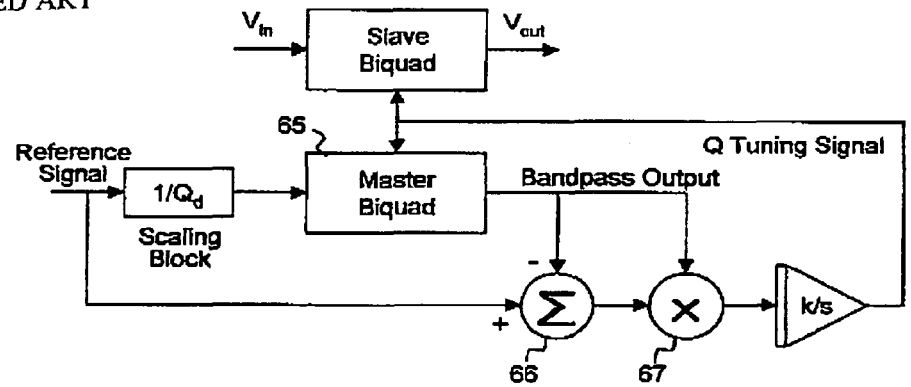
FIG. 4 is a circuit diagram showing still another configurational example of a filter circuit according to the background art.

Since the control signal that is input to variable negative resistor 3 is also applied to the Q-tune terminal of filter section 1, the filter characteristics of filter section 1 may be brought closely to the desired frequency characteristics at the time α=0 shown in FIG. 3.

The principles of a process wherein the DC potential difference between the differential output lines of differential voltage-to-current converting circuit 2 depends on the resistance value of variable negative resistor 3 will be described below.

Figure 7:
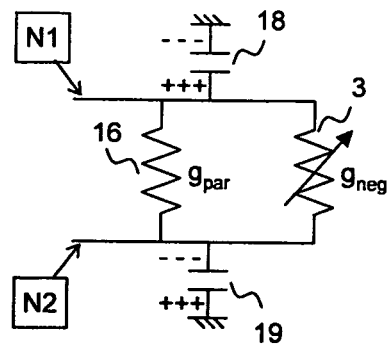
FIG. 7 is a circuit diagram showing a connected state of elements in the output node of a voltage-to-current converting circuit shown in FIG. 5.

FIG. 7 is a circuit diagram showing a connected state of elements in the output node of differential voltage-to-current converting circuit 2 shown in FIG. 5.

As shown in FIG. 7, parasitic resistor 16 at the output of differential voltage-to-current converting circuit 2, variable negative resistor 3, and capacitors 18, 19 are connected to the output node of differential voltage-to-current converting circuit 2. Parasitic resistor 16 has parasitic conductance $g_{par}$, and variable negative resistor 3 has conductance $-g_{neg}$. Capacitors 8, 9 refer to a combination of parasitic capacitive components including the gate capacitor of a MOS transistor at the input of a next circuit block and a capacitor with respect to the substrate. Node N1 refers to a node to which one terminal of parasitic resistor 16, one terminal of variable negative resistor 3, and one terminal of capacitor 18 are connected, and node N2 refers to a node to which one terminal of parasitic resistor 16, one terminal of variable negative resistor 3, and one terminal of capacitor 19 are connected. The other terminals of capacitors 18, 19 are connected to ground in terms of alternating currents.

It is assumed that potential difference $V_{inst}$ is developed between N1 and N2 at a certain instant due to thermal noise, making the potential at N1 higher than the potential at N2. At this instant, positive charges are collected in the N1-side terminal of capacitor 18, and negative charges are collected in the N2-side terminal of capacitor 19.

If $g_{par}$ is greater than $g_{neg}$, for example, then current which is equal to the product of $V_{inst}$ and $g_{par}-g_{neg}$ flows from N1 to N2 according to the Ohm's law. Therefore, the positive charges that are accumulated in the N1-side terminal of capacitor 18 move to N2, and the negative charges that are accumulated in the N2-side terminal of capacitor 19 move to N1. In other words, the positive charges in capacitor 18 and the negative charges in capacitor 19 cancel each other out. The charges in capacitors 18, 19 are reduced, making potential difference $V_{inst}$ between N1 and N2 converge to nil.

If $g_{par}$ is smaller than $g_{neg}$, then current flows from N2 to N1. The positive charges that are accumulated in the N1-side terminal of capacitor 18 and the negative charges that are accumulated in the N2-side terminal of capacitor 19 are thus increased. Potential difference $V_{inst}$ between N1 and N2 uniformly increases with time.

Generally, the parasitic conductance of parasitic resistor 16 increases as potential difference $V_{inst}$ increases. After potential difference $V_{inst}$ between N1 and N2 has uniformly increased, it is stabilized when $g_{par}$ and $g_{neg}$ are equal to each other.

The parasitic conductance of parasitic resistor 16 increases as potential difference $V_{inst}$ increases for the following reasons: It is assumed that differential voltage-to-current converting circuit 2 is of a circuit arrangement shown in FIG. 8.

Figure 8:
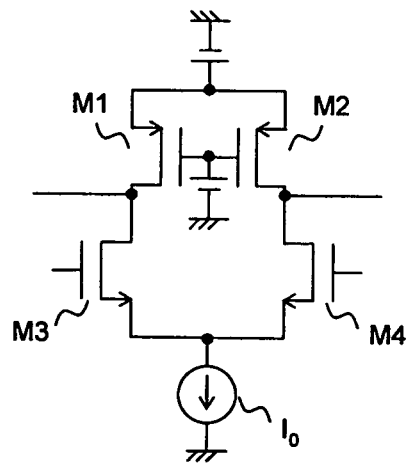
FIG. 8 is a circuit diagram showing a configurational example of the voltage-to-current converting circuit shown in FIG. 5.

In differential voltage-to-current converting circuit 2 shown in FIG. 8, differential input terminals are provided by the gate terminals of n-type MOSFETs M3, M4, and differential output terminals by the drain terminals of n-type MOSFETs M3, M4. Since the source terminals of n-type MOSFETs M3, M4 are connected to current source 10, the sum of drain currents of n-type MOSFETs M3, M4 is constant at all times. The drain terminals of n-type MOSFETs M3, M4 are connected to p-type MOSFETs M1, M2 that are biased into a saturated region and operate as current sources.

In voltage-to-current converting circuit 2 shown in FIG. 8, $g_{par}$ is substantially equal to the sum of the conductances between the drain and source terminals of p-type MOSFETs M1, M2. When the potential difference between the differential output lines increases, the drain-to-source voltage of p-type MOSFET M1 or M2 greatly decreases, bringing the operating point into an unsaturated region. In the unsaturated region, the conductance between the drain and source terminals is much greater than in the saturated region. Therefore, the parasitic conductance of parasitic resistor 16 increases.

Figure 9:
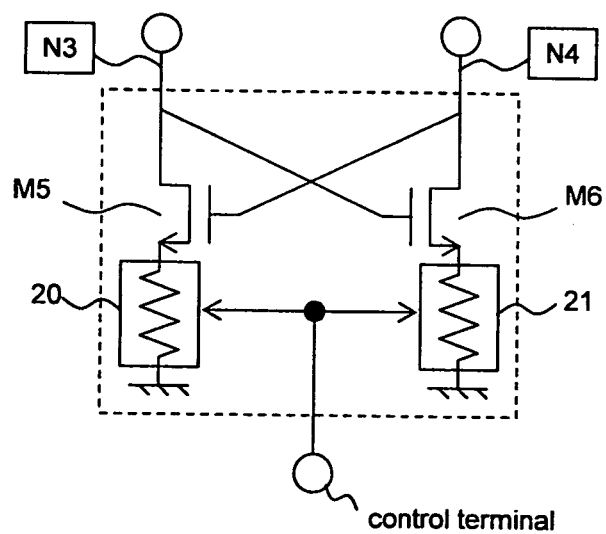
FIG. 9 is a circuit diagram showing a configurational example of a variable negative resistor shown in FIG. 5.

FIG. 9 is a circuit diagram showing variable negative resistor 3 by way of example.

In variable negative resistor 3 shown in FIG. 9, two n-type MOS transistors M5, M6 are cross-connected such that the gate terminal of one of the transistors is connected to the drain terminal of the other transistor.

The drain terminals of n-type MOS transistors M5, M6 are used as respective noes N3, N4. When a higher voltage is applied to node N3 than node N4, variable negative resistor 3 shown in FIG. 9 operates as follows:

Since the gate voltage of n-type MOS transistor M5 is lower than the gate voltage of n-type MOS transistor M6, the current flowing through n-type MOS transistor M5 is smaller than the current flowing through n-type MOS transistor M6. This corresponds to the flow of current from node N4 to node N3 in a differential mode. Since the potential is higher at node N3 than at node N4, this operation is a negative resistance operation. Variable negative resistors 20, 21 have one terminal connected respectively to the source terminals of n-type MOS transistors M5, M6 and other terminals connected to ground. With this arrangement, variable negative resistors 20, 21 impart a source degeneration effect to n-type MOS transistors M5, M6.

The conductance of variable negative resistor 3 shown in FIG. 9 determines the conversion gain for converting gate voltage signals of n-type MOS transistors M5, M6 into drain currents. Using resistance values R of variable negative resistors 20, 21, conversion gain gm is expressed by the following equation 6:

$$gm = \frac{gm_{mos}}{1 + gm_{mos} \cdot R} \quad \text{[Equation 6]}$$

where $gm_{mos}$ represents the voltage-to-current conversion gain of n-type MOS transistors M5, M6.

Equation 6 indicates that it is possible to control the conductance of variable negative resistor 3 by controlling resistance values R.

Figure 10:
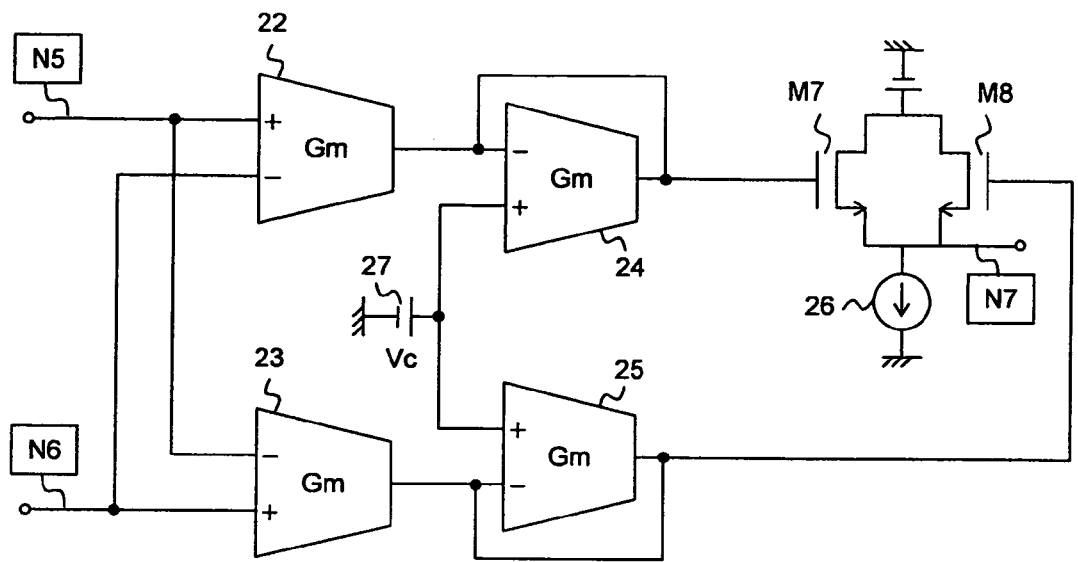
FIG. 10 is a circuit diagram showing a configurational example of a detector shown in FIG. 5.

FIG. 10 is a circuit diagram showing detector 4 by way of example.

In detector 4 shown in FIG. 10, the difference between DC voltage signals input to nodes N5, N6 is converted into differential current signals by differential-input/single-output voltage-to-current converting circuits 22, 23.

The differential current signals are input to negative terminals of voltage-to-current converting circuits 24, 25. Voltage-to-current converting circuits 24, are of a negative feedback loop configuration wherein the negative input is short-circuited to the output terminal. Fixed voltage Vc is applied from reference voltage source 27 to the positive terminals of voltage-to-current converting circuits 24, 25. In this arrangement, voltage-to-current converting circuits 24, 25 operate as resistive elements.

The differential current signals input to the negative terminals of voltage-to-current converting circuits 24, 25 are converted into differential voltage signals with an in-phase voltage secured to Vc. The differential voltage signals are input to the gate terminals of n-type MOS transistors M7, M8, which have equal parameters of gate lengths and widths, and have source terminals connected to each other and to current source 26 (whose current value is represented by $I_0$). Differential voltage Vd input to the gate terminals of n-type MOS transistors M7, M8 and potential Vs at the source terminals thereof are related to each other according to the following equation 7:

$$Vs = Vc - Vth - \sqrt{\frac{I_0}{\beta} - \frac{V_d^2}{4}} \quad \text{[Equation 7]}$$

where Vth, β represent a threshold value and a β factor of n-type MOS transistors M7, M8.

Equation 7 indicates that when Vd=0, Vs takes a maximum value, and when the absolute value of Vd increases, regardless of whether Vd is positive or negative, Vs decreases monotonously.

Therefore, detector 4 shown in FIG. 10 is capable of outputting a voltage signal which corresponds 1:1 to the absolute value of the potential difference between the input DC voltage signals.

Figure 11:
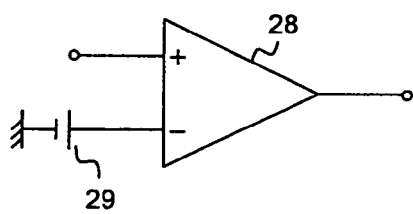
FIG. 11 is a circuit diagram showing a configurational example of a controller shown in FIG. 5.

FIG. 11 is a circuit diagram showing controller 5 by way of example.

In controller 5 shown in FIG. 11, reference voltage source 29 (whose voltage value is represented by Vref1) is connected to a negative terminal of operational amplifier 28, and voltage signal is input to a positive terminal thereof. Reference voltage source 29 outputs an amplified differential voltage between the voltage signal and Vref1.

According to the present exemplary embodiment, as described above, rather than the amplitude of an AC signal being not detected unlike the background art, a DC potential difference is detected, and variable negative resistor 3 connected between the differential output lines of differential voltage-to-current converting circuit 2 is controlled based on the detected DC potential difference, thereby automatically adjusting the output conductance of differential voltage-to-current converting circuit 2.

The output conductance of differential voltage-to-current converting circuit 2 depends on the conductance of variable negative resistor 3. Therefore, the output conductance can be adjusted with high accuracy by controlling variable negative resistor 3. Furthermore, since only the DC voltages and the direct currents are handled, the circuit configuration is simple, and electric power consumption and the chip area taken up by the circuit are reduced.

(2nd Exemplary Embodiment)

Figure 12:
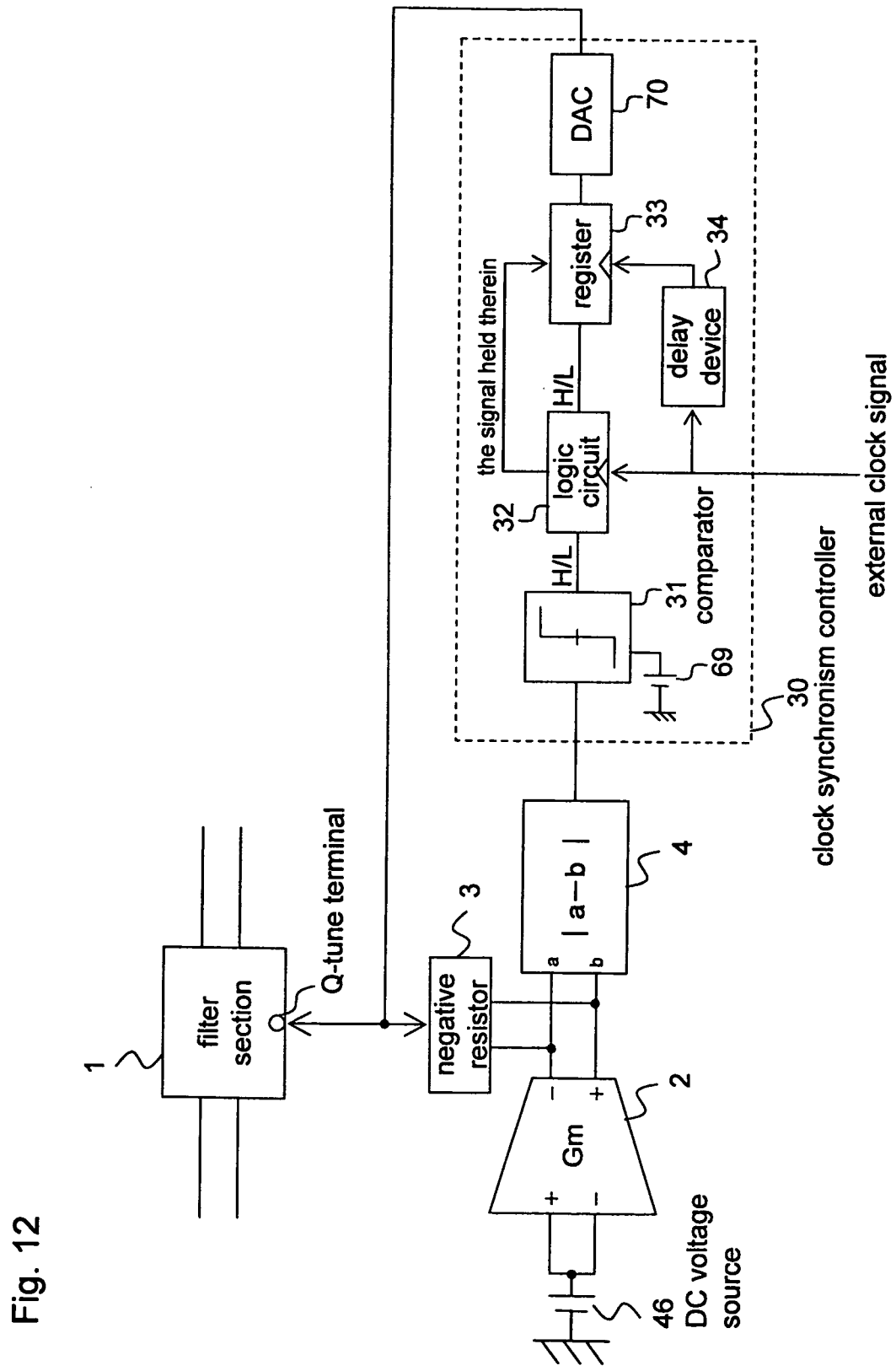
FIG. 12 is a block diagram showing the configuration of an automatic output conductance adjusting circuit according to a second exemplary embodiment of the present invention.

FIG. 12 is a block diagram showing the configuration of an automatic output conductance adjusting circuit according to a second exemplary embodiment of the present invention.

As shown in FIG. 12, the automatic output conductance adjusting circuit according to the present exemplary embodiment is different from the first exemplary embodiment shown in FIG. 5 in that controller 5 is replaced with clock synchronism controller 30 which operates in synchronism with an external clock signal.

Clock synchronism controller 30 is supplied with an output signal from detector 4 and updates a control signal supplied to variable negative resistor 3 per external clock pulse. The output level of clock synchronism controller 30 is of a stepwise value. In other words, clock synchronism controller 30 is capable of controlling stepwise the absolute value of conductance $g_{neg}$ of variable negative resistor 3.

Comparator 31 determines the magnitude relationship between the output voltage output from detector 4 and voltage value Vref2 of reference voltage 69. Voltage value Vref2 is set to a value between the output of detector 4 at the time that conductance $g_{neg}$ is of a minimum value greater than parasitic conductance $g_{par}$ and the output of detector 4 at the time that conductance $g_{neg}$ is of a maximum value smaller than parasitic conductance $g_{par}$.

Logic circuit 32 and register 33 generate a control signal to be supplied to variable negative resistor 3 based on the output from comparator 31 as follows: Differential voltage-to-current converting circuit 2, variable negative resistor 3, and detector 4 are of the respective circuit arrangements shown in FIGS. 8, 9, and 10. The output node of differential voltage-to-current converting circuit 2 is expressed by the circuit model shown in FIG. 7.

In an initial state, logic circuit 32 and register 33 set conductance $g_{neg}$ of variable negative resistor 3 to a minimum value that is sufficiently smaller than parasitic conductance $g_{par}$. At a first clock pulse, since parasitic conductance $g_{par}$ is greater than conductance $g_{neg}$, the potential difference between the differential output lines of differential voltage-to-current converting circuit 2 is essentially nil. Therefore, the output from detector 4 is of a maximum value. Comparator 31 outputs a low (hereinafter referred to as "L") signal since voltage value Vref2 is smaller than the input signal. In this case, logic circuit 32 and register 33 update the level of the control signal to be supplied to variable negative resistor 3 in order to increase the level of conductance $g_{neg}$ by one step. At subsequent clock pulses, if comparator 31 produces an L signal, then logic circuit 32 and register 33 increase the level of the control signal to be supplied to variable negative resistor 3 by one step. If the output signal from comparator 31 changes to a high (hereinafter referred to as "H") level, then it means that conductance $g_{neg}$ exceeds parasitic conductance $g_{par}$. At this time, logic circuit 32 and register 33 reduce the level of the control signal to be supplied to variable negative resistor 3 by one step. Subsequently, the level of the control signal is maintained.

According to the above process, the absolute value of conductance $g_{neg}$ can be maximized under the condition in which it does not exceed parasitic conductance $g_{par}$, and conductance $g_{neg}$ and parasitic conductance $g_{par}$ can be adjusted to a substantially equal state.

The present exemplary embodiment is characterized in that the level of the control signal output from clock synchronism controller 30 is stepwise. If the level of the control signal is continuous, then the feedback circuit made up of variable negative resistor 3, detector 4, and clock synchronism controller 30 may possibly oscillate. According to the present exemplary embodiment, such oscillation can be avoided.

Operational details of logic circuit 32 and register 33 will be described below.

Logic circuit 32 is supplied at its input terminal with either an H signal or an L signal from comparator 31 as a result of comparison between the output voltage of detector 4 and voltage value Vref2 of reference voltage 69. Logic circuit 32 updates the output signal and the voltage held therein in synchronism with the external clock signal that is input to a clock terminal thereof. The output signal from logic circuit 32 and the voltage held therein are input to register 33.

Register 33 updates the output level in synchronism with the clock signal input to a clock terminal thereof. The updated output level is output through DAC 70. Since the clock operation of register 33 has to be performed after the clock operation of logic circuit 32 is completed, the clock signal input to register 33 needs to be delayed by about one-half of a clock pulse from the clock signal input to logic circuit 32. The clock signal input to register 33 is delayed when the external clock signal is input to the clock terminal of register 33 via delay device 34.

It is assumed that the signal input to logic circuit 32 is represented by $D_n$, the signal held therein by $R_n$, and the signal output therefrom by $out_n$, and the signal output from register 33 is represented by $outr_n$. The suffix "n" refers to a clock pulse number, and the suffix "n−1" refers to a signal which is one clock pulse ahead. Therefore, $D_{n-1}$ represents an input signal which is one clock pulse ahead.

Figure 13:
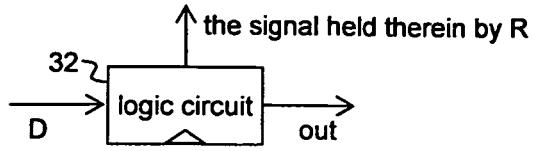
FIG. 13 is a truth table illustrative of operation of a logic circuit shown in FIG. 12.

When logic circuit 32 is in an initial state, $R_0$ is L. If $R_{n-1}$ is L, then $out_n$ is equal to $D_n$. If $D_n$ and $D_{n-1}$ are in an equal state, then $R_n$ remains L. If $D_n$ is inverted with respect to $D_{n-1}$, then $R_n$ becomes H. Once $R_n$ becomes H, $R_n$ subsequently remains H. The above operation is tabulated in a truth table shown in FIG. 13.

Register 33 next to logic circuit 32 has multivalued voltage information therein, and can output voltage signal $outr_n$ in a plurality of stepwise levels. Since the voltage difference between adjacent levels of the voltage signal directly determines the adjusting accuracy of the Q-tune, it needs to be set depending on the adjusting accuracy according to the specifications.

Figure 14:
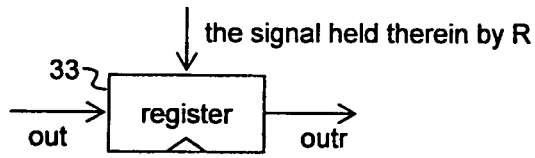
FIG. 14 is a truth table illustrative of operation of a register shown in FIG. 12.

When $R_n$ that is L is input to register 33, register 33 increments or decrements the level of $outr_n$ by one step from level H or L of $out_n$. When $R_n$ changes from level L to level R, register 33 returns the level of $outr_n$ to the state which is two clock pulses earlier. Subsequently, $R_n$ that is H is continuously input to register 33, and $outr_n$ continuously keeps the preceding level. The above operation is tabulated in a truth table shown in FIG. 14.

As described above, the present exemplary embodiment offers the same advantages as those of the first exemplary embodiment and is additionally advantageous in that the output level of clock synchronism controller 30 is controlled stepwise to reliably prevent the feedback loop from oscillating.

(3rd Exemplary Embodiment)

Figure 15:
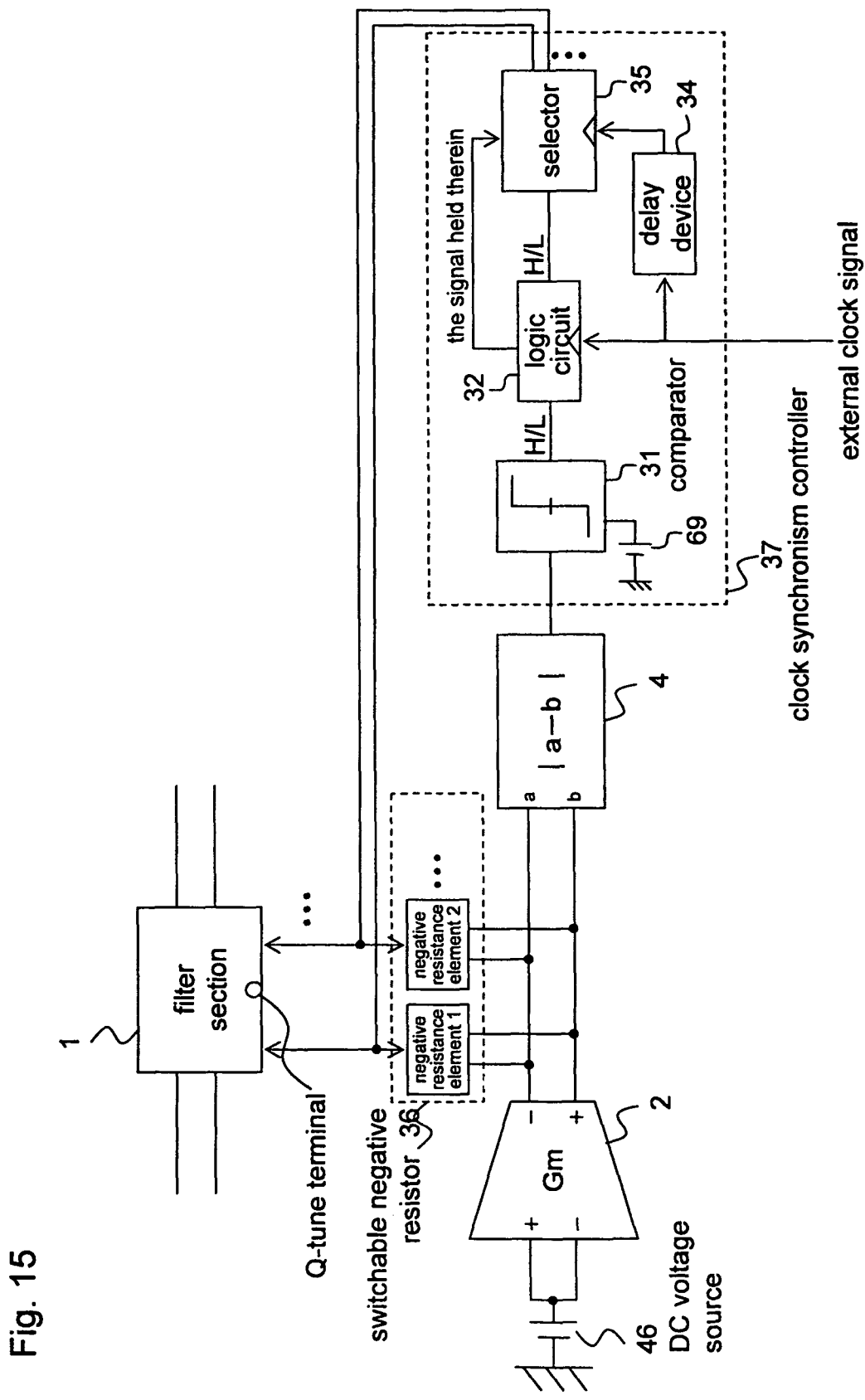
FIG. 15 is a block diagram showing the configuration of an automatic output conductance adjusting circuit according to a third exemplary embodiment of the present invention.

FIG. 15 is a block diagram showing the configuration of an automatic output conductance adjusting circuit according to a third exemplary embodiment of the present invention.

As shown in FIG. 15, the automatic output conductance adjusting circuit according to the present exemplary embodiment is different from the second exemplary embodiment shown in FIG. 12 in that variable negative resistor 3 is replaced with switchable negative resistor 36 and clock synchronism controller 30 is replaced with clock synchronism controller 37. Variable negative resistors 10 through 13 in filter section 1 shown in FIG. 6 are of the same configuration as switchable negative resistor 36.

Switchable negative resistor 36 comprises a plurality of parallel negative resistance elements having different conductances. Each of the negative resistance elements is independently turned on and off according to a switching signal Negative resistance element 1 has minimum conductance value $g_{neg1}$, and negative resistance element 2 has a value that is twice $g_{neg1}$. In other words, negative resistance element n has a value that is $2^{n-1}$ times $g_{neg1}$.

Switchable negative resistor 36 thus constructed has a variable conductance range from minimum value $g_{neg1}$ to maximum value $(g_{neg1}*2^{n-1})$ based on a combination of on- and off-states of the negative resistance elements. $g_{neg1}$ and n are determined from the adjusting accuracy and the variable range required for the Q-tune.

Clock synchronism controller 37 is different from clock synchronism controller 30 according to the second exemplary embodiment shown in FIG. 12 in that register 33 and DAC 70 are replaced with selector 35.

Selector 35 outputs n switching signals for independently turning on and off n negative resistance elements in switchable negative resistor 36.

As with register 33, selector 35 is supplied with signal $out_n$ output from logic circuit 32 and signal $R_n$ held in logic circuit 32. Selector 35 outputs signal $outs_n$ that is updated in synchronism with the clock signal and input to switchable negative resistor 36.

Logic operation of selector 35 will b described below.

When $R_n$ that is L is input to selector 35, selector 35 outputs signal $outs_n$ for incrementing or decrementing the conductance value of switchable negative resistor 36 by one level from level H or L of $out_n$. When $R_n$ changes from level L to level R, selector 35 returns the level of $outs_n$ to the state which is two clock pulses earlier. Subsequently, $R_n$ that is H is continuously input to selector 35, and $outs_n$ continuously keeps the preceding level.

As described above, the present exemplary embodiment offers the same advantages as those of the second exemplary embodiment and is additionally advantageous in that the switchable negative resistor provides a wider adjustment range.

(4th Exemplary Embodiment)

Figure 16:
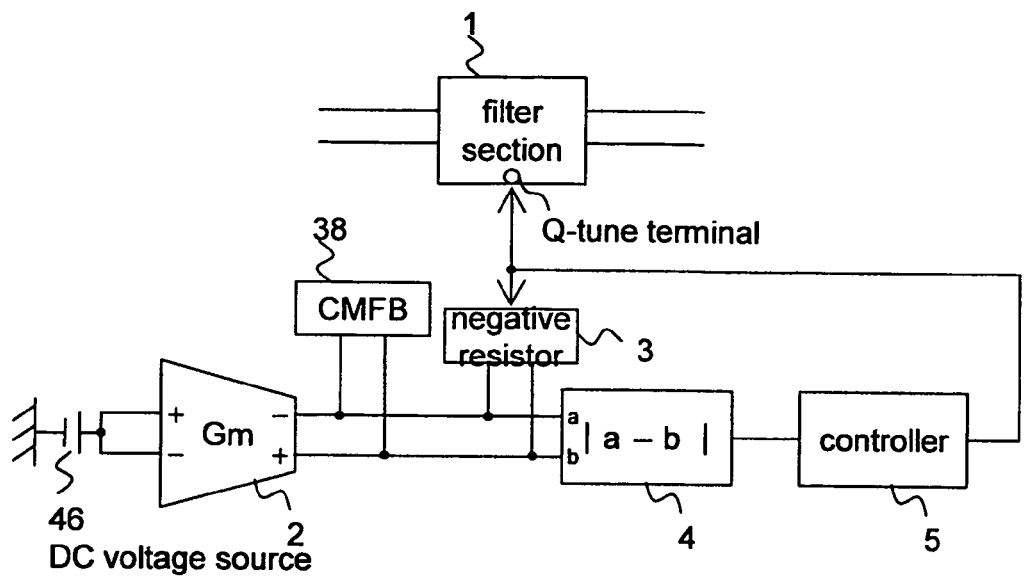
FIG. 16 is a block diagram showing the configuration of an automatic output conductance adjusting circuit according to a fourth exemplary embodiment of the present invention.

FIG. 16 is a block diagram showing the configuration of an automatic output conductance adjusting circuit according to a fourth exemplary embodiment of the present invention.

As shown in FIG. 16, the automatic output conductance adjusting circuit according to the present exemplary embodiment is different from the first exemplary embodiment shown in FIG. 5 in that it additionally includes in-phase voltage feedback circuit (CMFB) 38 which is connected to the differential output lines of differential voltage-to-current converting circuit 2.

According to the first exemplary embodiment, when the sum of parasitic conductance $g_{par}$ at the output node of differential voltage-to-current converting circuit 2 and conductance—$g_{neg}$ of variable negative resistor 3 is adjusted to a value that is nearly nil, differential voltage-to-current converting circuit 2 has a large gain in an in-phase mode. Voltage value Vdc of DC voltage source 46 that is connected between the differential input lines of differential voltage-to-current converting circuit 2 corresponds to an in-phase input signal supplied to differential voltage-to-current converting circuit 2. If Vdc is slightly shifted from a designed value due to production process variations, then the operating point of the in-phase voltages on the differential output lines of differential voltage-to-current converting circuit 2 may possibly become a point that is close to the power supply or the ground potential. The operating point is different from the operating point of filter section 1 to be adjusted. This means that though differential voltage-to-current converting circuit 2 which is a replica is adjusted highly accurately, filter section 1 is not adjusted accurately.

According to the present exemplary embodiment, in-phase voltage feedback circuit 38 is added to keep constant the in-phase voltages on the differential output lines of differential voltage-to-current converting circuit 2 regardless of production process variations.

In-phase voltage feedback circuit 38 supplies a current to the differential output lines for adjusting the in-phase voltages on the differential output lines of differential voltage-to-current converting circuit 2 to a desired voltage. A configurational example of in-phase voltage feedback circuit 38 is shown in FIG. 17.

Figure 17:
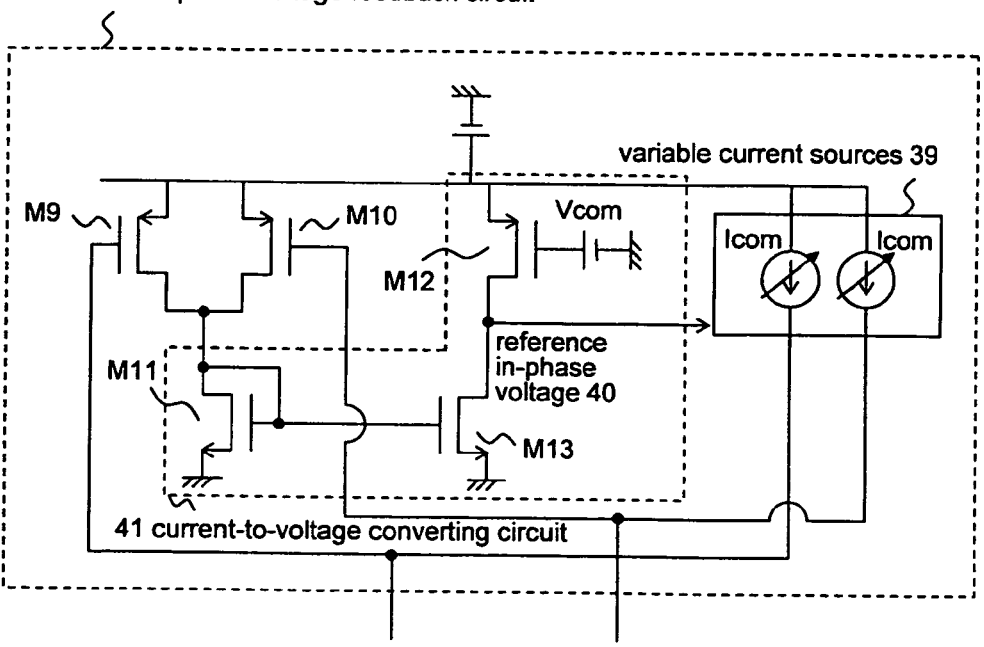
FIG. 17 is a circuit diagram showing a configurational example of an in-phase voltage feedback circuit shown in FIG. 16.

In in-phase voltage feedback circuit 38 shown in FIG. 17, the voltage signals on the differential output lines are applied as input voltage signals to the gate terminals of p-type MOS transistors M9, M10 having the same gate length and width. If it is assumed that the voltage signals applied to the gate terminals of p-type MOS transistors M9, M10 are represented as $V_{cm}+V_{diff}/2$, $V_{cm}-V_{diff}/2$, then $V_{cm}$ corresponds to the in-phase voltages and $V_{diff}$ to the differential voltage. If p-type MOS transistors M9, M10 have identical voltage-to-current conversion gain $gm_9$, then the drain currents of p-type MOS transistors M9, M10 are represented respectively by $gm_9 \times (V_{cm}+V_{diff}/2)$, $gm_9 \times (V_{cm}-V_{diff}/2)$. The drain current of n-type MOS transistor M11 is sum Isum of the drain currents of p-type MOS transistors M9, M10. Isum is expressed by the following equation 8:

$$I\text{sum}=2 \cdot gm_9 \cdot V_{cm} \qquad \text{[Equation 8]}$$

Equation 8 indicates that Isum depends only on the in-phase voltage signal. n-type MOS transistor M11, p-MOS transistor M12, and n-type MOS transistor M13 make up current-to-voltage converting circuit 41 having an input terminal provided by the drain terminal of n-type MOS transistor M11 and an output terminal provided by the drain terminal of p-MOS transistor M12. If the conductances of the drain terminals of p-MOS transistor M12 and n-type MOS transistor M13 are represented by $g_{12}$, $g_{13}$, respectively, then conversion gain $R_V$ is expressed as follows:

$$R_v = -\frac{1}{g_{12}+g_{13}} \qquad \text{[Equation 9]}$$

The output signal from current-to-voltage converting circuit 41 is input to current control terminals of variable current sources 39. Variable current sources 39 are connected to the respective differential output lines, and supply equal currents thereto. When signal voltages applied to the current control terminals of variable current sources 39 become greater, variable current sources 39 increases the currents. When signal voltages applied to the current control terminals of variable current sources 39 become smaller, variable current sources 39 reduce the currents.

With the gate lengths and widths of M9, M10, M11 being equal to each other and the gate widths of M11, M13 being of a ratio of 2:1, in-phase voltage feedback circuit 38 can set in-phase voltages $V_{cm}$ on the different output lines to voltage value $V_{com}$ of reference in-phase voltage 40 applied to the gate terminal of M12. If in-phase voltages $V_{cm}$ applied to in-phase voltage feedback circuit 38 are greater than $V_{com}$, then the currents output from variable current sources 39 to the differential output lines are reduced. When the currents are reduced, in-phase voltages $V_{cm}$ on the different output lines are corrected so as to be smaller. If in-phase voltages $V_{cm}$ are smaller than $V_{com}$, then in-phase voltages $V_{cm}$ are corrected so as to be higher. In-phase voltage feedback circuit 38 is thus capable of controlling in-phase voltages $V_{cm}$ so as to be equal to $V_{com}$.

As described above, the present exemplary embodiment offers the same advantages as those of the first exemplary embodiment and is additionally advantageous in that the in-phase voltages on the differential output lines of differential voltage-to-current converting circuit 2 can be kept constant. In this manner, the accuracy of the Q-tune is prevented from being degraded by variations in the in-phase voltages.

(5th Exemplary Embodiment)

Figure 18:
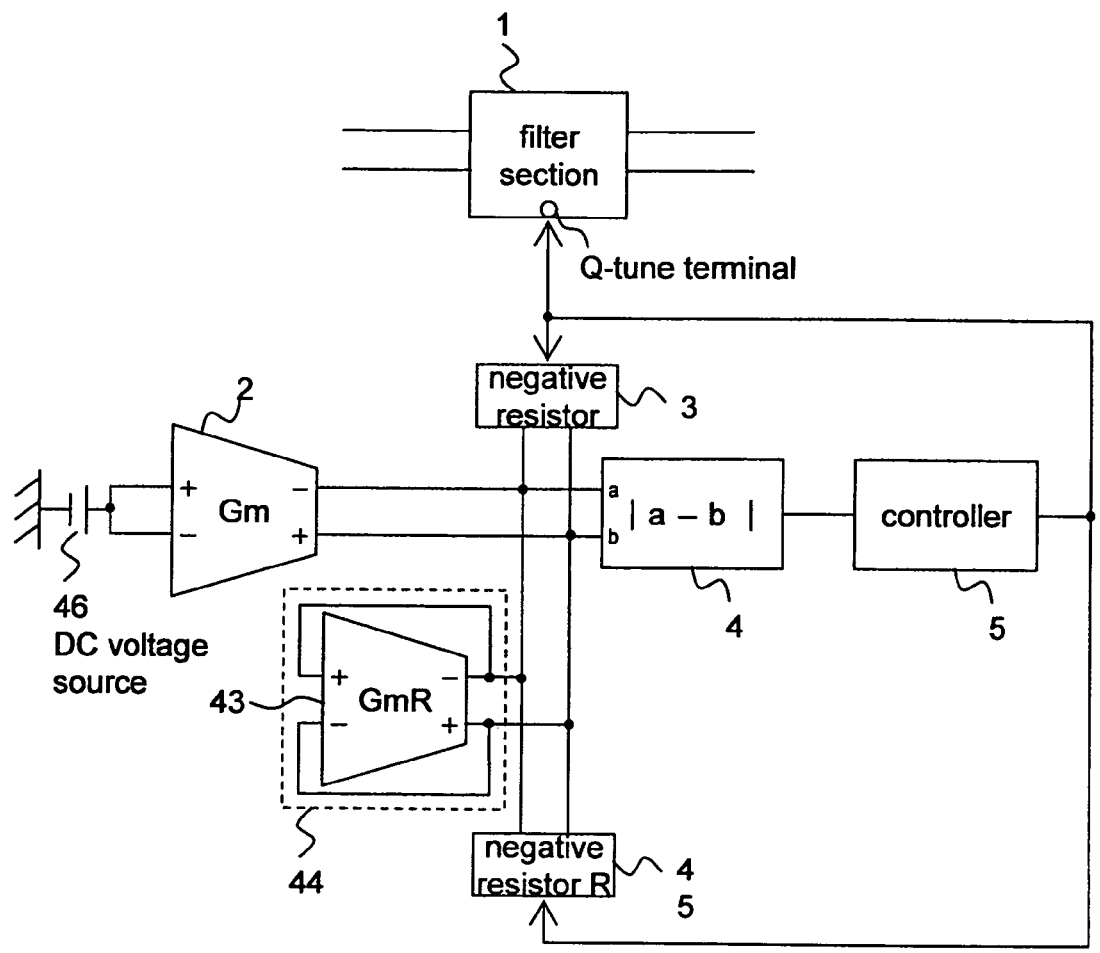
FIG. 18 is a block diagram showing the configuration of an automatic output conductance adjusting circuit according to a fifth exemplary embodiment of the present invention.

FIG. 18 is a block diagram showing the configuration of an automatic output conductance adjusting circuit according to a fifth exemplary embodiment of the present invention.

As shown in FIG. 18, the automatic output conductance adjusting circuit according to the present exemplary embodiment is different from the first exemplary embodiment shown in FIG. 5 in that resistor 44 and variable negative resistor 45 are additionally connected to the differential output lines of differential voltage-to-current converting circuit 2.

Resistor 44 comprises voltage-to-current converting circuit 43 whose differential input and output terminals are connected in a negative feedback loop. If the conversion gain of voltage-to-current converting circuit 43 is represented by $gm_R$, then the resistance value of resistor 44 is represented by the reciprocal of $gm_R$. Variable negative resistor 45 has a control terminal which is supplied with the same signal as the control signal that is input to variable negative resistor 3.

According to the present exemplary embodiment, even when the sum of parasitic conductance $g_{par}$ at the output node of differential voltage-to-current converting circuit 2 and conductance $-g_{neg}$ of variable negative resistor 3 is adjusted to a value that is nearly nil, the voltage gain in the in-phase mode between the input and output terminals of differential voltage-to-current converting circuit 2 (whose conversion gain is represented by gm) is given as $gm/gm_R$.

In the first embodiment, when $g_{par}$ and $g_{neg}$ are adjusted to equal values, differential voltage-to-current converting circuit 2 has a large gain in the in-phase mode. Therefore, when the in-phase voltages on the differential input lines of differential voltage-to-current converting circuit 2 are slightly changed, then the operating point of the in-phase voltages on the differential output lines of differential voltage-to-current converting circuit 2 may possibly become a point that is close to the power supply or the ground potential.

According to the present exemplary embodiment, variations in the operating point of the in-phase voltages are minimized by setting $gm_R$ to a value that is equivalent to or sufficiently greater than gm.

The circuit parameters of voltage-to-current converting circuit 43 and variable negative resistor 45 are designed by scaling the circuit parameters of differential voltage-to-current converting circuit 2 and variable negative resistor 3. Under the condition in which parasitic conductance $g_{par}$ at the output node of differential voltage-to-current converting circuit 2 and conductance $-g_{neg}$ of variable negative resistor 3 cancel each other out, the circuit parameters thus designed allow parasitic conductance $g_{par43}$ at the output node of voltage-to-current converting circuit 43 and conductance $-g_{neg45}$ of variable negative resistor 45 to cancel each other out. Under the above condition, the general conductance at the output node of differential voltage-to-current converting circuit 2 is similarly nil. This means that $g_{par}$ and $g_{neg}$ are controlled so as to be of equal values at the converging point of the Q-tune. According to the present exemplary embodiment, therefore, differential voltage-to-current converting circuit 2 can be adjusted highly accurately as with the first exemplary embodiment.

As described above, the present exemplary embodiment offers the same advantages as those of the first exemplary embodiment and is additionally advantageous in that the gain of the in-phase voltages at the output node of differential voltage-to-current converting circuit 2 can be minimized. In this manner, the accuracy of the Q-tune is prevented from being degraded by variations in the in-phase voltages.

The invention claimed is:

1. An automatic output conductance adjusting circuit for automatically adjusting the output conductance of a differential current output type circuit including a variable negative resistor connected between differential output lines thereof, the automatic output conductance adjusting circuit comprising:

a replica of said differential current output type circuit, the replica being supplied a DC value as an input signal;

a variable negative resistor connected between differential output lines of said replica;

a detector for detecting a DC potential difference between the differential output lines of said replica; and a controller for controlling a conductance of said variable negative resistor connected between the differential output lines of said differential current output type circuit, and a conductance of said variable negative resistor connected between the differential output lines of said replica, based on the DC potential difference detected by said detector, wherein the output of the detector is input to the controller and the controller compares an input value of the input signal and a reference value held in the controller and generates a control signal by taking into account of both a present comparison result and a comparison result of one clock pulse ahead.

2. The automatic output conductance adjusting circuit according to claim 1, wherein an absolute value of a sum of a parasitic conductance between the differential output lines of said replica and the conductance of said variable negative resistor is of a stable value equal to or lower than a preset value.

3. The automatic output conductance adjusting circuit according to claim 1, wherein said controller controls the conductance of said variable negative resistor stepwise.

4. The automatic output conductance adjusting circuit according to claim 3, wherein said controller controls an absolute value of the conductance of said variable negative resistor so as to be of a maximum value under the condition that the absolute value of the conductance of said variable negative resistor will not exceed an absolute value of a parasitic conductance between the differential output lines of said replica.

5. The automatic output conductance adjusting circuit according to claim 3, wherein said controller includes a circuit for reading a signal representing the DC potential difference detected by said detector in synchronism with an external clock signal and controlling the conductance of said variable negative resistor depending on a pattern of the read signal.

6. The automatic output conductance adjusting circuit according to claim 1, further comprising:

an in-phase voltage feedback circuit connected between the differential output lines of said replica, for controlling in-phase voltages respectively on the differential output lines.

7. The automatic output conductance adjusting circuit according to claim 1, wherein the controller, if the present comparison result is "Low", generates the control signal so as to increase a level of the conductance of the variable negative resistor by one step, and if the present comparison result changes to a "High" from "Low", generates the control signal so as to decrease the level of the conductance of the variable negative resistor by one step and, subsequently, the control signal is maintained regardless of a comparison result.

8. A filter circuit including a differential current output type circuit including a variable negative resistor connected between differential output lines thereof, comprising:

a replica of said differential current output type circuit;

a variable negative resistor connected between differential output lines of said replica;

a detector for detecting a DC potential difference between the differential output lines of said replica; and a controller for controlling a conductance of said variable negative resistor connected between the differential output lines of said differential current output type circuit, and a conductance of said variable negative resistor connected between the differential output lines of said replica, based on the DC potential difference detected by said detector.

\* \* \* \* \*